(12) United States Patent
Huang et al.

(10) Patent No.: US 11,916,023 B2
(45) Date of Patent: Feb. 27, 2024

(54) THERMAL INTERFACE MATERIAL HAVING DIFFERENT THICKNESSES IN PACKAGES

(71) Applicant: Taiwan Semiconductor Manufacturing Co., Ltd., Hsinchu (TW)

(72) Inventors: Sung-Hui Huang, Dongshan Township (TW); Da-Cyuan Yu, Hsinchu (TW); Kuan-Yu Huang, Taipei (TW); Pai Yuan Li, Taichung (TW); Hsiang-Fan Lee, Hsinchu (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 468 days.

(21) Appl. No.: 17/012,255

(22) Filed: Sep. 4, 2020

(65) Prior Publication Data

US 2020/0402926 A1    Dec. 24, 2020

Related U.S. Application Data

(63) Continuation of application No. 15/609,206, filed on May 31, 2017, now Pat. No. 10,770,405.

(51) Int. Cl.
*H01L 21/56* (2006.01)
*H01L 21/48* (2006.01)
(Continued)

(52) U.S. Cl.
CPC ........ *H01L 23/562* (2013.01); *H01L 21/4853* (2013.01); *H01L 21/4857* (2013.01);
(Continued)

(58) Field of Classification Search
CPC ............... H01L 23/562; H01L 23/3114; H01L 23/3128; H01L 23/3135; H01L 23/3675; H01L 23/3733; H01L 23/3736; H01L 23/3737; H01L 23/49822; H01L 23/49827; H01L 23/49838; H01L 23/367;
(Continued)

(56) References Cited

U.S. PATENT DOCUMENTS 9,812,374 B1    11/2017  Refai-Ahmed et al.
10,163,852 B2 *  12/2018  Yu ...................... H01L 23/3675
(Continued)

FOREIGN PATENT DOCUMENTS

CN      103715150 A     4/2014
DE   102011086473 A1    5/2012
(Continued)

*Primary Examiner* — Didarul A Mazumder
*Assistant Examiner* — Gustavo G Ramallo
(74) *Attorney, Agent, or Firm* — Slater Matsil, LLP

(57) ABSTRACT

A package includes a package component, a device die over and bonded to the package component, a metal cap having a top portion over the device die, and a thermal interface material between and contacting the device die and the metal cap. The thermal interface material includes a first portion directly over an inner portion of the device die, and a second portion extending directly over a corner region of the device die. The first portion has a first thickness. The second portion has a second thickness greater than the first thickness.

20 Claims, 18 Drawing Sheets

(51) Int. Cl.
    *H01L 23/00* (2006.01)
    *H01L 23/31* (2006.01)
    *H01L 23/367* (2006.01)
    *H01L 23/373* (2006.01)
    *H01L 23/498* (2006.01)
    *H01L 25/00* (2006.01)
    *H01L 25/065* (2023.01)
    *H01L 25/18* (2023.01)

(52) U.S. Cl.
    CPC ........ *H01L 21/486* (2013.01); *H01L 21/4882* (2013.01); *H01L 21/563* (2013.01); *H01L 21/565* (2013.01); *H01L 23/3114* (2013.01); *H01L 23/3128* (2013.01); *H01L 23/3135* (2013.01); *H01L 23/3675* (2013.01); *H01L 23/3733* (2013.01); *H01L 23/3736* (2013.01); *H01L 23/3737* (2013.01); *H01L 23/49822* (2013.01); *H01L 23/49827* (2013.01); *H01L 23/49838* (2013.01); *H01L 24/32* (2013.01); *H01L 24/83* (2013.01); *H01L 25/0655* (2013.01); *H01L 25/18* (2013.01); *H01L 25/50* (2013.01); *H01L 23/367* (2013.01); *H01L 24/16* (2013.01); *H01L 24/73* (2013.01); *H01L 24/97* (2013.01); *H01L 2224/13147* (2013.01); *H01L 2224/13155* (2013.01); *H01L 2224/16225* (2013.01); *H01L 2224/16227* (2013.01); *H01L 2224/26175* (2013.01); *H01L 2224/32225* (2013.01); *H01L 2224/73204* (2013.01); *H01L 2224/73253* (2013.01); *H01L 2224/83385* (2013.01); *H01L 2224/83951* (2013.01); *H01L 2224/92225* (2013.01); *H01L 2924/00014* (2013.01); *H01L 2924/10158* (2013.01); *H01L 2924/15174* (2013.01); *H01L 2924/15311* (2013.01); *H01L 2924/16152* (2013.01); *H01L 2924/165* (2013.01); *H01L 2924/181* (2013.01); *H01L 2924/18161* (2013.01); *H01L 2924/35121* (2013.01)

(58) Field of Classification Search
    CPC ............... H01L 23/3107; H01L 23/373; H01L 23/4012; H01L 21/4853; H01L 21/4857; H01L 21/486; H01L 21/563; H01L 21/565
    See application file for complete search history.

(56) References Cited

U.S. PATENT DOCUMENTS

| | | |
|---|---|---|
| 2002/0149098 A1 | 10/2002 | Seyama et al. |
| 2003/0090875 A1 | 5/2003 | Fitzgerald et al. |
| 2003/0102526 A1 | 6/2003 | Dias et al. |
| 2005/0012205 A1 | 1/2005 | Dias et al. |
| 2005/0029672 A1 | 2/2005 | Hsu et al. |
| 2005/0040498 A1 | 2/2005 | Dias et al. |
| 2006/0084254 A1 | 4/2006 | Attarwala |
| 2006/0137902 A1 | 6/2006 | Kubota et al. |
| 2007/0018310 A1 | 1/2007 | Sato |
| 2007/0145571 A1 | 6/2007 | Lee et al. |
| 2007/0228530 A1 | 10/2007 | Sato et al. |
| 2008/0017975 A1 | 1/2008 | Deppisch et al. |
| 2010/0044856 A1 | 2/2010 | Sri-Jayantha et al. |
| 2010/0225007 A1 | 9/2010 | Pagaila et al. |
| 2010/0246133 A1 | 9/2010 | Schmidt et al. |
| 2011/0044007 A1 | 2/2011 | Mizunashi |
| 2011/0272824 A1* | 11/2011 | Pagaila ............... H01L 29/0657 257/777 |
| 2012/0098119 A1 | 4/2012 | Refai-Ahmed et al. |
| 2012/0119346 A1* | 5/2012 | Im ......................... H01L 21/563 257/E23.18 |
| 2013/0105963 A1* | 5/2013 | Choi ....................... H01L 24/73 257/706 |
| 2014/0091461 A1 | 4/2014 | Shen |
| 2014/0134796 A1 | 5/2014 | Kelly et al. |
| 2014/0210068 A1 | 7/2014 | Bartley et al. |
| 2014/0264799 A1* | 9/2014 | Gowda ............. H01L 23/49575 438/122 |
| 2014/0264815 A1 | 9/2014 | Yew et al. |
| 2015/0035135 A1 | 2/2015 | Hung et al. |
| 2015/0108628 A1 | 4/2015 | Yu et al. |
| 2015/0187679 A1 | 7/2015 | Ho et al. |
| 2015/0279761 A1* | 10/2015 | Bet-Shliemoun ....... H01L 23/04 257/714 |
| 2016/0111391 A1 | 4/2016 | Paek et al. |
| 2017/0133310 A1* | 5/2017 | Kelly ................ H01L 23/49811 |
| 2017/0294422 A1 | 10/2017 | Solimando et al. |
| 2018/0358280 A1* | 12/2018 | Gandhi .................. H01L 24/73 |
| 2019/0244947 A1* | 8/2019 | Yu ........................... H01L 24/92 |

FOREIGN PATENT DOCUMENTS

| | | |
|---|---|---|
| JP | 2002353388 A | 12/2002 |
| JP | 2007035688 A | 2/2007 |
| JP | 2007266150 A | 10/2007 |

* cited by examiner

THERMAL INTERFACE MATERIAL HAVING DIFFERENT THICKNESSES IN PACKAGES

PRIORITY CLAIM AND CROSS-REFERENCE

This application is a continuation of U.S. patent application Ser. No. 15/609,206, entitled "Thermal Interface Material Having Different Thicknesses in Packages," filed on May 31, 2017, which application is incorporated herein by reference.

BACKGROUND

In some Three-Dimensional Integrated Circuits (3DIC), device dies are first bonded to an interposer, which is further bonded to a package substrate to form a package. The heat generated in the device dies during their operation needs to be dissipated. In the conventional structures, to dissipate the heat, the substrates of the device dies are attached to a metal lid, which helps dissipate heat, and also acts as a stiffener. Accordingly, the heat generated in the device dies is spread to the metal lid. A heat sink may be attached to the metal lid to further dissipate the heat conducted to the metal lid.

The attachment of the device dies to the metal lid is through a Thermal Interface Material (TIM), which may include an epoxy-based material. Since the TIM has relatively low thermal conductivity, it is preferred that the TIM is thin so that the TIM does not introduce too much thermal resistance between the device dies and the metal lid.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1 through 7A and 7B illustrate the cross-sectional views of intermediate stages in the formation of packages in accordance with some embodiments.

DETAILED DESCRIPTION

Figure 1:
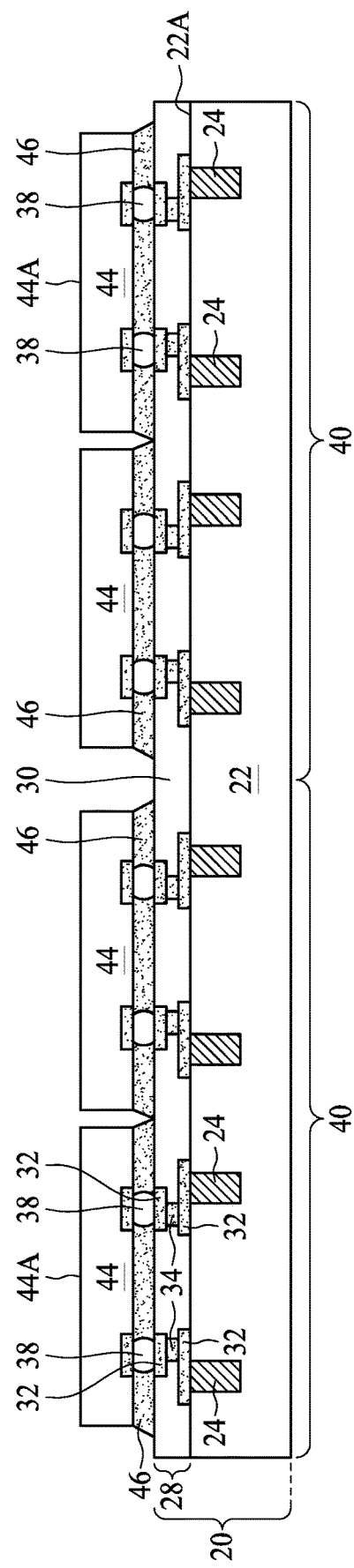

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A package including a metal cap, device dies, and the methods of forming the same are provided in accordance with various exemplary embodiments. The intermediate stages of forming the package are illustrated. The variations of some embodiments are discussed. Throughout various views and illustrative embodiments, like reference numbers are used to designate like elements.

FIGS. 1 through 7A illustrate the cross-sectional views of intermediate stages in the formation of a package in accordance with some embodiments of the present disclosure. The steps shown in FIGS. 1 through 7A are also reflected schematically in the process flow shown in FIG. 11.

FIG. 1 illustrates a cross-sectional view of package component 20, which may be an interposer wafer, a package substrate strip, a device die wafer, or a package. Package component 20 includes a plurality of package components 40, which may be identical to each other. Package components 40 may be device chips (also known as dies when sawed apart, which may or may not include active and/or passive devices), package substrates, packages, or the like. Throughout the description, package components 40 are alternatively referred to as interposers 40 hereinafter, while they may be other types of package components as discussed above.

In accordance with some embodiments of the present disclosure, package component 20 includes substrate 22, which may be a semiconductor substrate such as a silicon substrate. Substrate 22 may also be formed of another semiconductor material such as silicon germanium, silicon carbon, or the like. In accordance with some embodiments, active devices such as transistors (not shown) are formed at surface 22A of semiconductor substrate 22. Passive devices (not shown) such as resistors and/or capacitors may also be formed in package component 20. In accordance with alternative embodiments of the present disclosure, substrate 22 may be a semiconductor substrate or a dielectric substrate, and the respective package component does not include active devices therein. In accordance with these embodiments, package component 20 may, or may not, include passive devices formed therein.

Through-Vias (TVs) 24, which are alternatively referred to as metal posts, may be formed to extend from top surface 22A of substrate 22 into substrate 22. TVs 24 are also sometimes referred as through-substrate vias or through-silicon vias when substrate 22 is a silicon substrate. Interconnect structure 28 is formed over substrate 22, and is used to electrically connect to the integrated circuit devices, if any, and TVs 24. Interconnect structure 28 may include a plurality of dielectric layers 30. Metal lines 32 are formed in dielectric layers 30. Vias 34 are formed between, and interconnecting, the overlying and underlying metal lines 32. In accordance with some embodiments of the present disclosure, dielectric layers 30 are formed of silicon oxide, silicon nitride, silicon carbide, silicon oxynitride, combinations thereof, and/or multi-layers thereof. Alternatively, dielectric layers 30 may include one or more low-k dielectric layer having a low dielectric constant(s) (k value(s)). The k values of the low-k dielectric materials in dielectric layers 30 may be lower than about 3.0, or lower than about 2.5, for example.

Electrical connectors 38 are formed at the top surface of package component 20. In accordance with some embodiments of the present disclosure, electrical connectors 38 include metal pillars, wherein solder caps may be, or may not be, formed on the top surfaces of the metal pillars. In accordance with alternative embodiments of the present disclosure, electrical connectors 38 comprise solder regions. In accordance with yet other embodiments, electrical connectors 38 may be copper pillar bump, solder bumps or composite bumps including copper posts, nickel layers, solder caps, Electro-less Nickel Immersion Gold (ENIG), Electro-less Nickel Electro-less Palladium Immersion Gold (ENEPIG), and/or the like, and/or a combination thereof.

Figure 11:
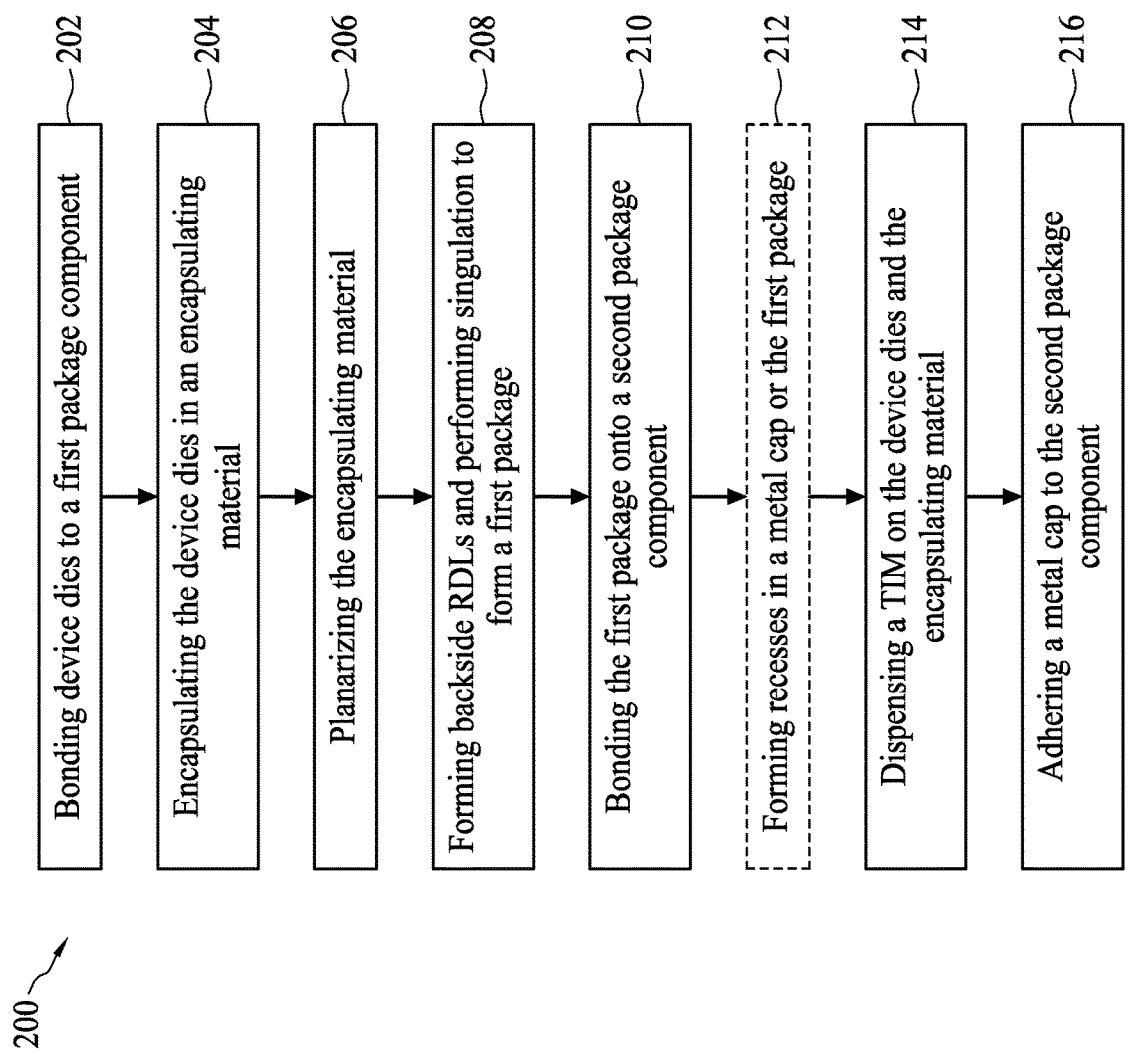
FIG. 11 illustrates a process flow for forming a package in accordance with some embodiments.

Package components 44 are bonded to package component 20, for example, through flip-chip bonding. The respective step is illustrated as step 202 in the process flow 200 as shown in FIG. 11. Electrical connectors 38 thus electrically couple the circuits in package components 44 to metal lines 32 and TVs 24 in package component 20. Package components 44 may be device dies including logic circuits, memory circuits, or the like. Accordingly, package components 44 are alternatively referred to as device dies 44 hereinafter. Alternatively, package components 44 may be packages that include dies bonded to the respective interposers, package substrates, and/or the like. A reflow is performed to bond device dies 44 to interposers 40 when electrically connectors 38 include solder regions.

On each of interposers 40, there may be one, two, three, or more device dies 44 bonded thereon. For example, as shown in FIG. 1, two device dies 44 are bonded to the same interposer 40. In accordance with some embodiments of the present disclosure, device dies 44 include semiconductor substrates, which may be silicon substrates in accordance with some embodiments of the present disclosure. Accordingly, the top surfaces 44A of device dies 44 may be the surfaces of a semiconductor material such as silicon.

Next, the gaps between device dies 44 and package component 20 are filled by underfill 46. Underfill 46 may include a polymer or an epoxy, which is used to protect electrical connectors 38 from stress. Underfill 46 may also be a molding underfill, which is dispensed when device dies 44 are encapsulated in the step shown in FIG. 2, wherein the same molding underfill is used as both underfill 46 and encapsulating material 48 in FIG. 2.

Figure 2:
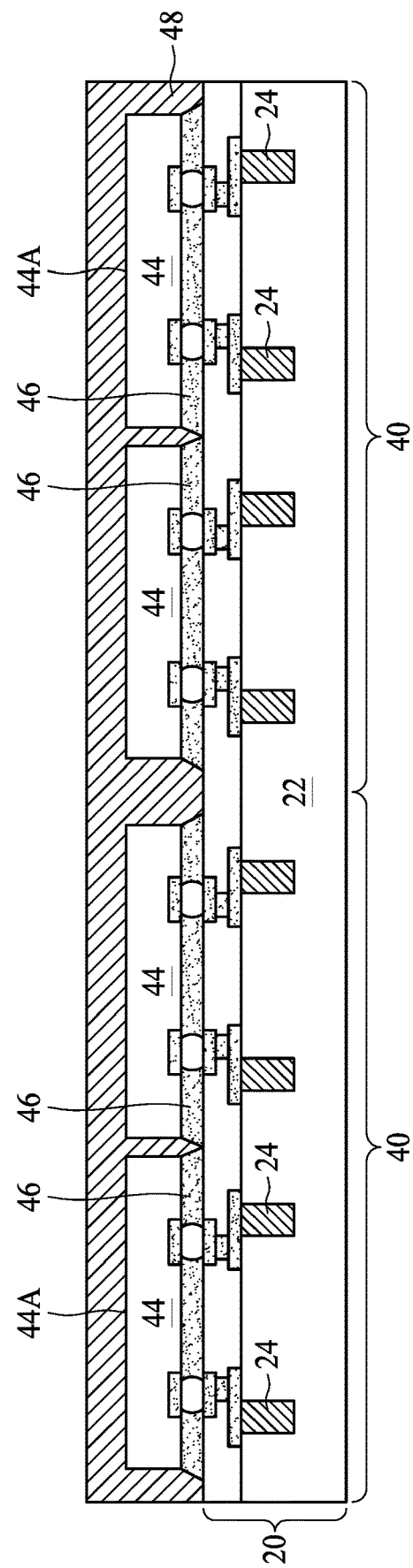

Referring to FIG. 2, encapsulating material 48 is encapsulated on device dies 44 and package component 20, for example, using compress molding, transfer molding, or the like. The respective step is illustrated as step 204 in the process flow 200 as shown in FIG. 11. In accordance with some embodiments of the present disclosure, encapsulating material 48 includes a molding compound, which includes a base material and fillers mixed in the base material. The base material may include a polymer, a resin, an epoxy, and/or the like. The fillers may be formed of spherical particles of silica, aluminum oxide, or the like. A curing step is performed to cure and solidify encapsulating material 48, wherein the curing may be a thermal curing, a Ultra-Violet (UV) curing, or the like. In accordance with some embodiments, device dies 44 are buried in encapsulating material 48.

Figure 3:
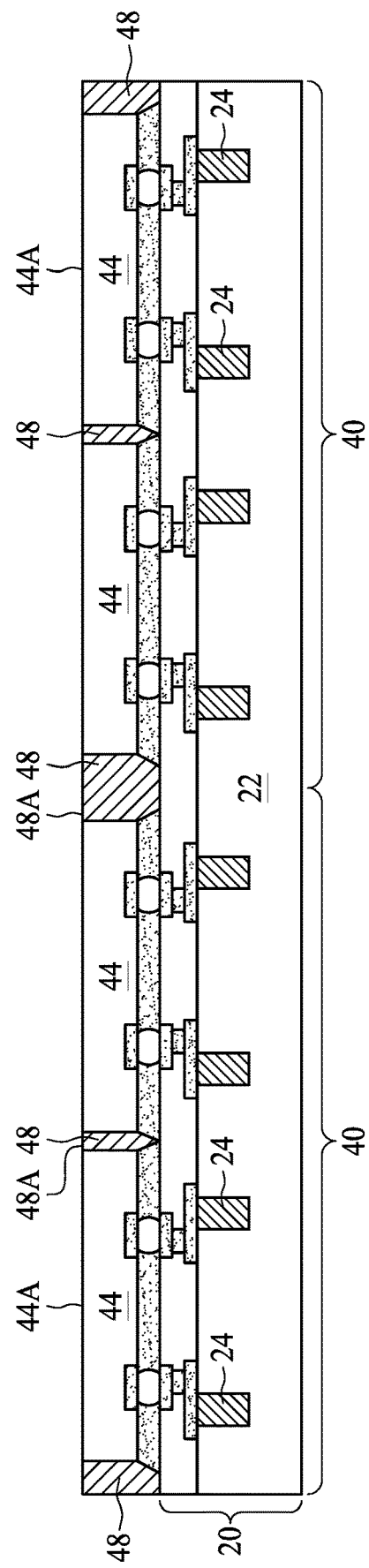

After the curing of encapsulating material 48, a planarization step such as Chemical Mechanical Polish (CMP) or mechanical grinding is performed to remove excess portions of encapsulating material 48, which excess portions are over the top surfaces 44A of device dies 44. The respective step is illustrated as step 206 in the process flow 200 as shown in FIG. 11. The resulting structure is shown in FIG. 3. Accordingly, top surface 44A of the substrates in device dies 44 are exposed, and are coplanar with top surface 48A of encapsulating material 48.

Figure 4:
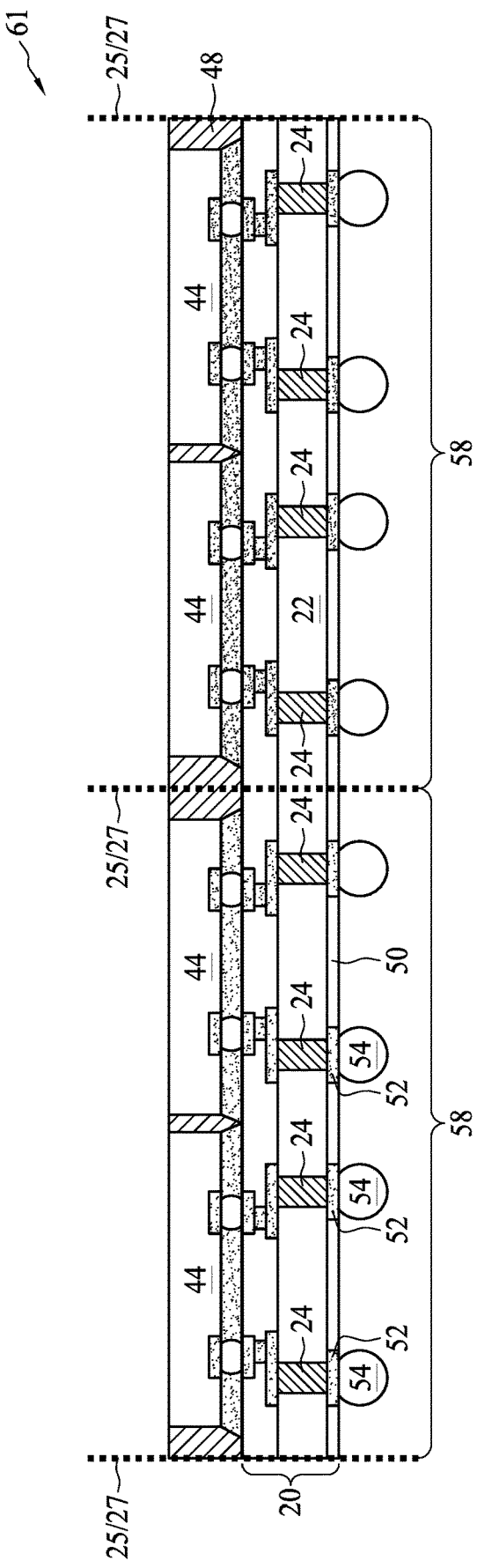

FIG. 4 illustrates the formation of the backside structure of package component 20. The respective step is illustrated as step 208 in the process flow 200 as shown in FIG. 11. In the formation of the backside structure, a backside grinding is performed on the backside of substrate 22 to thin substrate 22, until TVs 24 are exposed. Dielectric layer (or dielectric layers) 50 is formed on the backside of semiconductor substrate 22. RDLs 52 may be formed in dielectric layers 50. Electrical connectors 54 are also formed on the backside of package component 20 and electrically coupled to TVs 24. In accordance with some embodiments of the present disclosure, electrical connectors 54 are solder region. In accordance with other embodiments, electrical connectors 54 may include metal pads, metal bumps, solder caps, or the like. Throughout the description, the package shown in FIG. 4 is referred to as composite wafer 61.

Figure 10A:
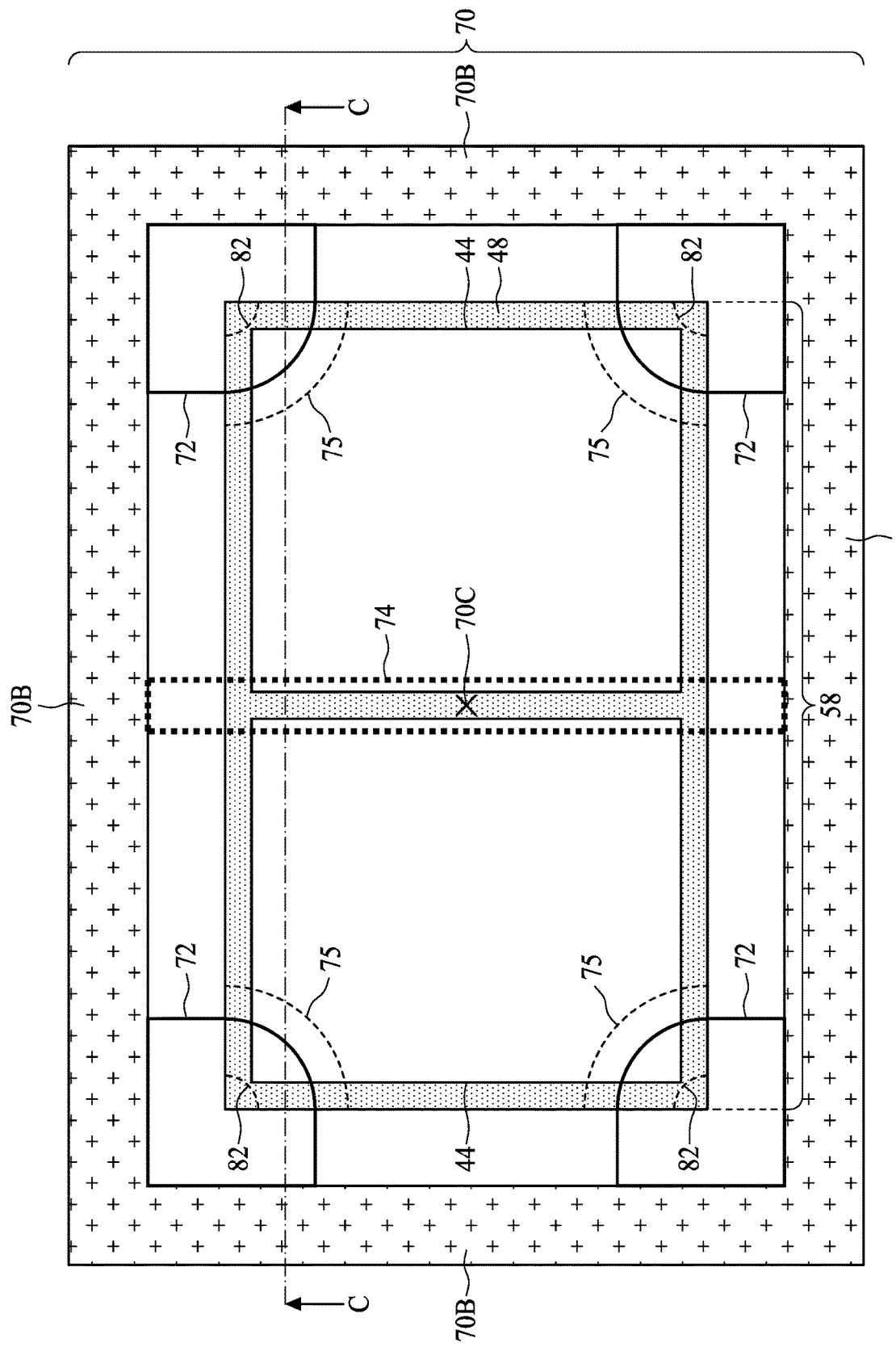
FIGS. 10A through 10E illustrate the top views of some packages in accordance with some embodiments.

Next, a singulation (dicing) is performed on composite wafer 61 along scribe lines 25/27 to saw the package shown in FIG. 4 into a plurality of packages 58, each including a stack of package components. The respective step is also illustrated as step 208 in the process flow 200 as shown in FIG. 11. Each of the resulting packages 58 includes one of the interposer 40 and the corresponding device dies 44 bonded thereon. A top view of an exemplary package 58 is shown in FIG. 10A. In the top view, encapsulating material 48 includes portions encircling device dies 44, and a portion between neighboring device dies 44.

Figure 5:
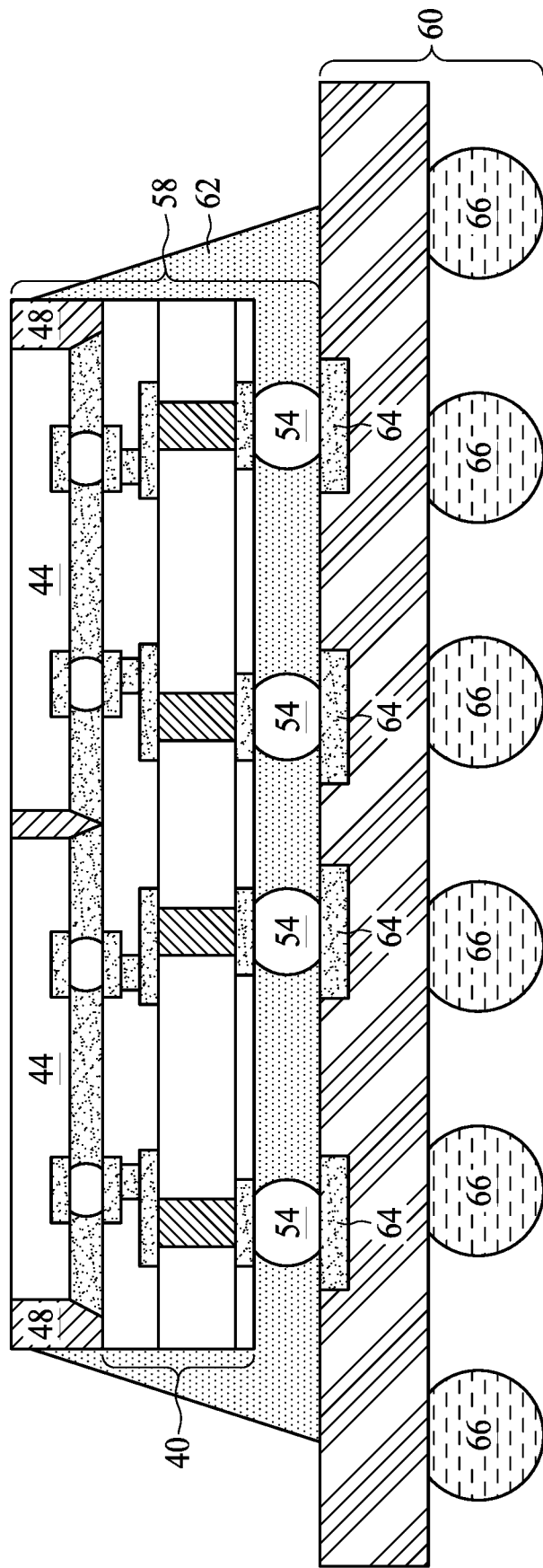

FIG. 5 illustrates the bonding of package 58 to package component 60, for example, through electrical connectors 54. The respective step is illustrated as step 210 in the process flow 200 as shown in FIG. 11. Package component 60 may be a package substrate, a Printed Circuit Board (PCB), or the like. Package component 60 may include electrical connectors (such as metal pads 64 and solder regions 66) formed on the opposite sides of package component 60. The electrical connectors on the opposite sides of package component 60 are electrically inter-coupled through metal lines and vias (not shown) formed inside package component 60. Underfill 62 may be dispensed into the gap between package 58 and package component 60, and cured. In accordance with some embodiments, underfill 62 also has some outer portions outside of the gap, which portions contact the outer sidewalls of package 58. The outer portions of underfill 62 may or may not contact encapsulating material 48.

Figure 6:
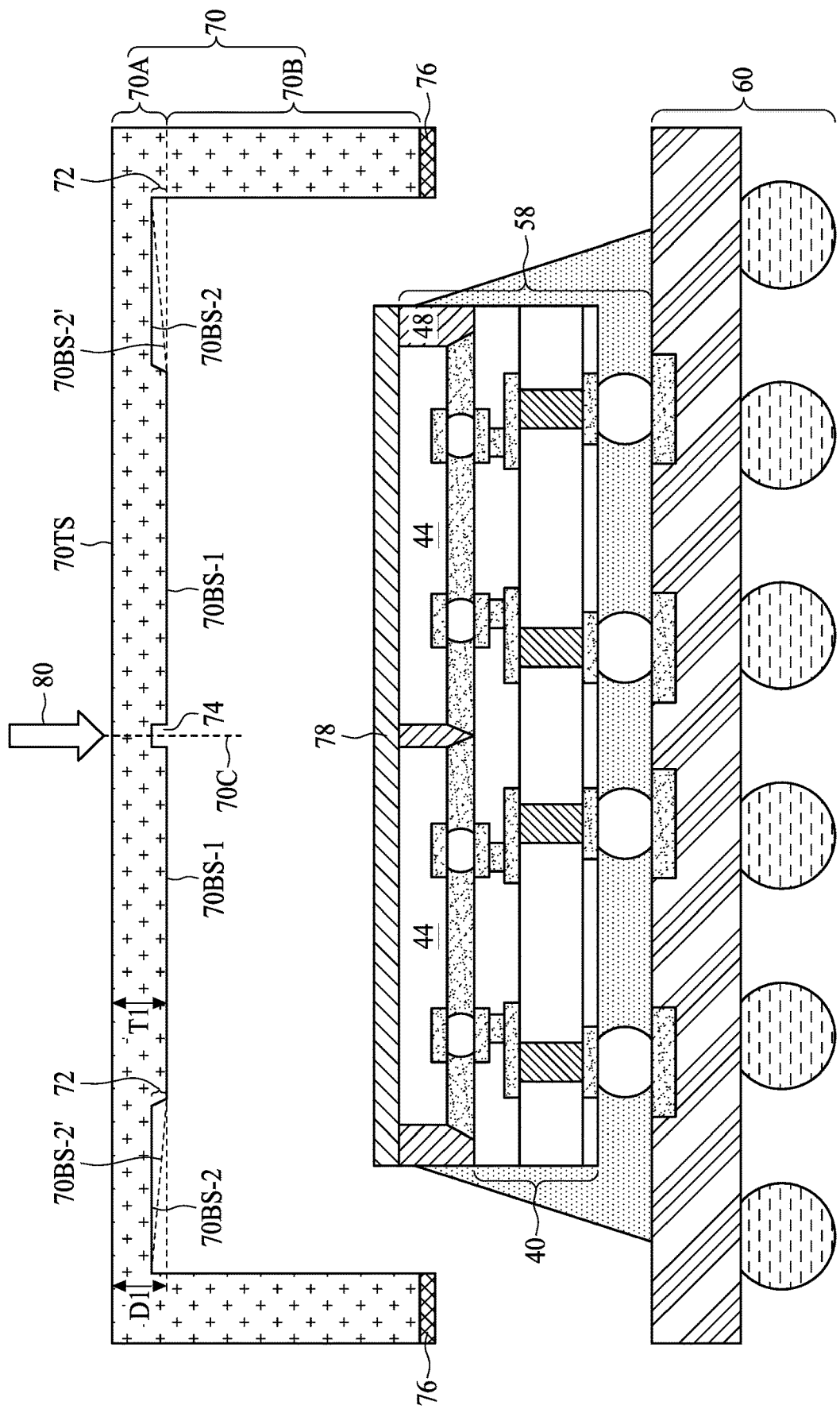

FIGS. 6 and 7 illustrate the adhesion of metal cap 70 onto the top surface of package component 60. Referring to FIG. 6, metal cap 70 is formed of a metal or a metal alloy, which has a high thermal conductivity, for example, higher than about 100 W/m*K. The material of metal cap 70 includes a metal or a metal alloy. For example, metal cap 70 may be formed of a metal or a metal alloy selected from Al, Cu, Ni, Co, stainless steel, and alloys thereof. In accordance with some embodiments of the present disclosure, the entire metal cap 70 is an integrated piece formed of the same homogenous metallic material. Accordingly, there may not be a distinguishable interface to separate different portions of metal cap 70.

Metal cap 70 includes top portion 70A and ring portion (skirt portion) 70B extending down from the bottom surface of top portion 70A. It is appreciated that top portion 70A and ring portion 70B may not have any distinguishable interface therebetween. Ring portion 70B, when viewed in a top view of metal cap 70, may form a full ring (as shown in FIGS. 10A through 10E), wherein the region encircled by ring portion 70B is large enough to accommodate package 58.

Top portion 70A has top surface 70TS, which may be a planar top surface that extends throughout the entire top portion 70A. Top portion 70A also has bottom surface 70BS-1, which may be the lowest surface in accordance with some embodiments. Bottom surface 70BS-1 may be parallel to the top surface 70TS, and the top-view area of bottom surface 70BS-1 is greater than 50 percent, and may be greater than about 80 percent of the top-view area of metal cap 70.

Recesses 72 are formed to extend from bottom surface 70BS-1 of top portion 70A into top portion 70A. The respective step is illustrated as step 212 in the process flow 200 as shown in FIG. 11. Recesses 72 may be formed through milling, coining, cutting, sawing, grinding, etching, or the like. Alternatively, recesses 72 exist when metal cap 70 is formed, rather than being formed later. Accordingly, the step 212 in FIG. 11 is illustrated using a dashed box to represent that this step may not need to be performed. Through recesses 72, bottom surfaces 70BS-2 of top portion 70A are also exposed. In accordance with some embodiments of the present disclosure, bottom surfaces 70BS-2 are planar and are parallel to top surface 70TS. In accordance with alternative embodiments, bottom surfaces 70BS-2 are straight but slanted, as schematically illustrated by dashed lines 70BS-2', wherein portions of the recesses 72 closer to ring portion 70B are increasingly deeper than the portions closer to the center 70C of metal cap 70.

In accordance with some embodiments of the present disclosure, recess 74 is further formed to extend from bottom surface 70BS-1 of metal cap 70 into metal cap 70. FIG. 10A illustrates an exemplary recess 74, which extends from one side portion of ring portion 70B to the opposite side portion. The count and the position of recess 74 are related to the number of device dies 44 and their positions, as will be discussed in subsequent paragraphs. In accordance with alternative embodiments of the present disclosure, recess 74 is not formed, and the entire bottom surface of metal cap 70, other than where recesses 72 are formed, is coplanar. Accordingly, recesses 74 are marked as dashed in FIGS. 10A through 10E to indicate that they may, or may not, be formed.

Referring back to FIG. 6, depths D1 of recesses 72 may be substantially uniform, or may be varying depending on where they are measured. In accordance with some embodiments of the present disclosure, depth D1 of recesses 72 is greater than about 10 μm or greater than about 20 μm, and may be in the range between about 30 μm and about 70 μm, wherein depth D1 is the maximum depth of recesses 72 if the depths D1 of recesses 72 are not uniform. It is appreciated that depth D1 of recesses 72 is related to the thickness of top portion 70A, and the greater the thickness of top portion 70A, the deeper the recesses 72 can be. In an exemplary embodiment of the present disclosure, thickness T1 of top portion 70A is in the range between about 0.5 mm and about 3 mm.

Adhesive film 76 is adhered to the bottom surface of ring portion 70B. In the bottom view of metal cap 70, adhesive film 76 may have the shape of a full ring. Thermal Interface Material (TIM) 78 is dispensed on the top of device dies 44 and encapsulating material 48. The respective step is illustrated as step 214 in the process flow 200 as shown in FIG. 11. TIM 78 has a good thermal conductivity, which may be greater than about 2 W/m*K, and may be equal to, or higher than, about 10 W/m*K or 50 W/m*K. TIM 78 may include a polymer, resin, or epoxy as a base material, and a filler to improve its thermal conductivity. The filler may include a dielectric filler such as aluminum oxide, magnesium oxide, aluminum nitride, boron nitride, and diamond powder. The filler may also be a metal filler such as silver, copper, aluminum, or the like. The filler may be in the form of spherical particles.

Figure 7A:
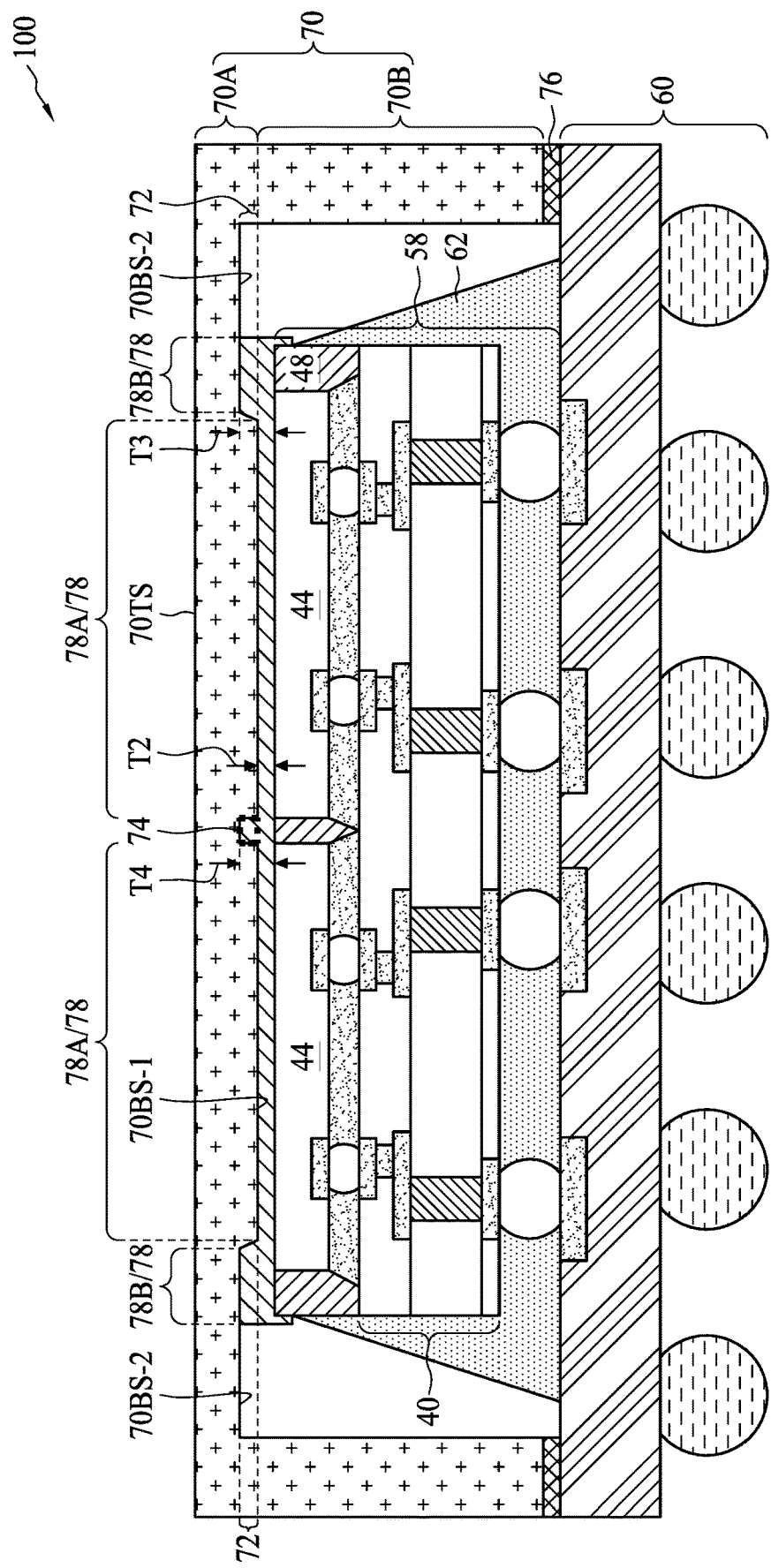

Metal cap 70 is pushed against package component 60, as represented by arrow 80, so that metal cap 70 is adhered to package component 60 through adhesive film 76. The respective step is illustrated as step 216 in the process flow 200 as shown in FIG. 11. The resulting package is referred to as package 100 hereinafter. The bottom surfaces 70BS-1 and 70BS-2 are also pushed against TIM 78, so that the portion of TIM 78 directly over device dies 44 and encapsulating material 48 have top surfaces in contact with bottom surfaces 70BS-1 and 70BS-2. The resulting structure is shown in FIG. 7A. TIM 78 is then cured and solidified, for example, in a thermal curing process.

TIM 78 includes majority portion(s) 78A (thinner portions) having thickness T2, and corner portions 78B (thicker portions) having thickness T3 greater than thickness T2. TIM portions 78B include the portions extending into recesses 72 and the portions directly underlying recesses 72. TIM 78 thus may also be conceived as having a planar thinner portion expanding throughout device dies 44 and encapsulating material 48, and protruding portions protruding from the planar thinner portion up into recesses 72 and 74. Making the majority portions 78A of TIM 78 to be thin can reduce the thermal resistance between metal cap 70 and device dies 44, and hence the heat generated by device dies 44 may be dissipated into metal cap 70 without experiencing excess thermal resistance. In accordance with some embodiments, thickness T2 is smaller than about 90 μm, and may be in the range between about 50 μm and about 90 μm. Thickness difference (T3-T2) may be greater than about 10 μm or greater than about 20 μm, and may be in the range between about 30 μm and about 70 μm. It is appreciated that if recesses 72 and 74 are not formed, the entire portion of the TIM 78 directly over device dies 44 and encapsulating material 48 will have thickness T2, which is small. In the packaging process, the package may experience multiple thermal circles, causing the bending of metal cap 70, TIM 78, and package 58. Delamination and cracking thus may occur between TIM 78 and the underlying device dies 44. The delamination and cracking is also severe at the corners of package 58 since the stress in these regions is higher than in other regions. By making the portions of TIM 78 to be thicker at the corners, its ability of absorbing stress is improved, and the delamination and cracking are less likely to occur.

FIG. 10A illustrates the top view of package 100 in accordance with various embodiments, wherein the cross-sectional view shown in FIG. 7A may be obtained from the plane containing line C-C as shown in FIGS. 10A through 10E. Referring to FIG. 10A as an example, the relative positions and the sizes of recesses 72 (relative to ring portion 70B and package 58) are illustrated. In accordance with some embodiments, recesses 72 extend from ring portion 70B toward center 70C of metal cap 70. Recesses 72 cover at least corner portions of package 58. In accordance with some embodiments, recesses 72 cover the corner portions of both device dies 44 and encapsulating material 48. In accordance with alternative embodiments, recesses 72 cover the corner portions of encapsulating material 48, but do not extend directly over the corner portions of device dies 44, wherein dashed lines 82 schematically illustrate the inner edges of the respective recesses 72.

As also shown in FIG. 10A, recess 74 is formed directly over the gap between neighboring device dies 44. Recess 74 may extend all the way to the opposite side portions (the illustrated top side portion and bottom side portion) of ring portion 70B. The width of recess 74 may be equal to, smaller than, or greater than the width of the gap between device dies 44. Accordingly, referring to FIG. 7A, recess 74 may be limited in the region directly over the gap between device dies 44, or expand laterally to cover the edge portions of device dies 44. Due to the formation of recess 74, TIM 78 also has a thick portion directly over the gap between device dies 44, and hence a greater volume of TIM 78 is provided to buffer the stress in this region. The thickness T4 of the portion of TIM 78 directly over the gap may be greater than, equal to, or smaller than thickness T3.

Figure 7B:
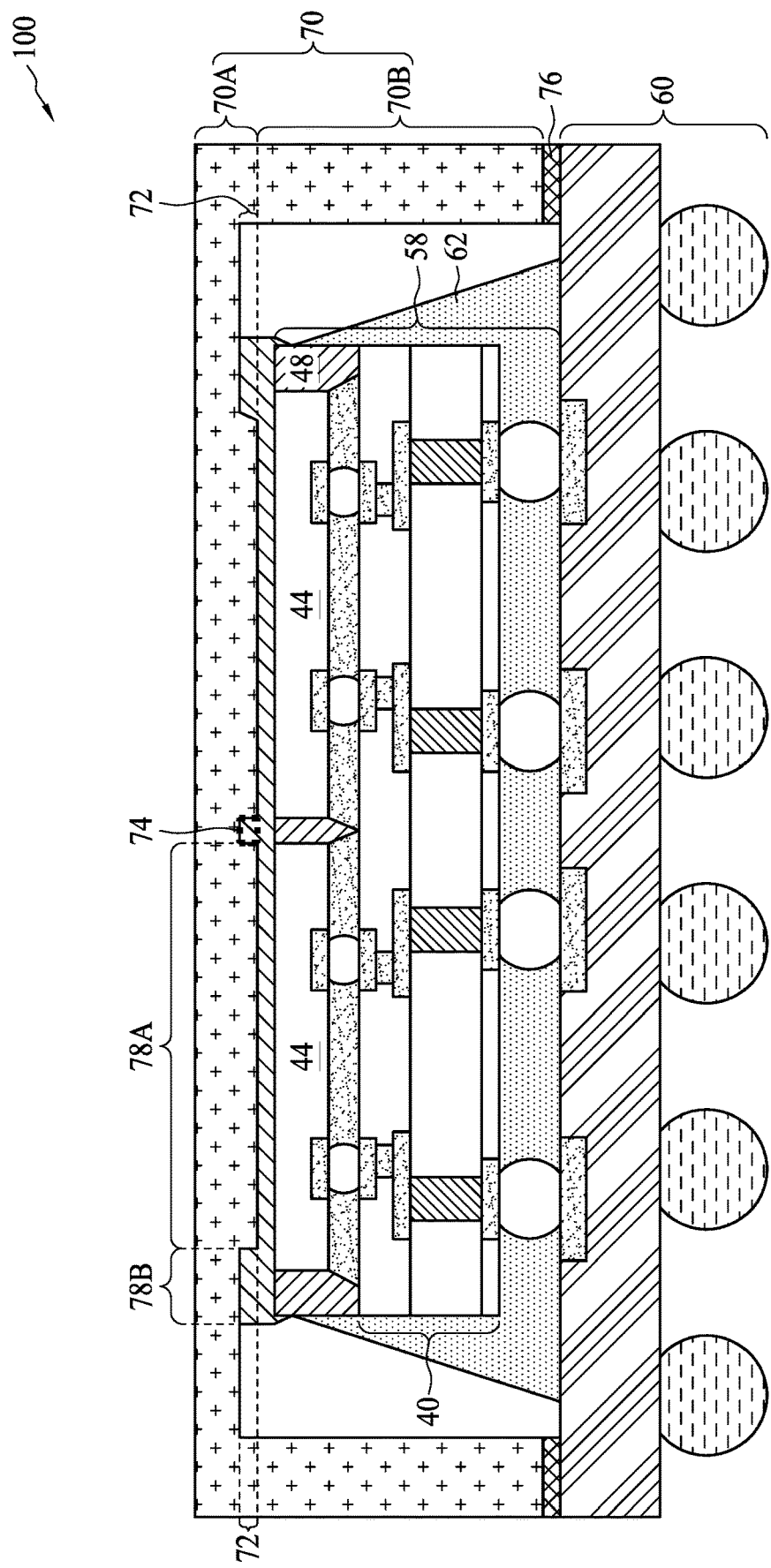

In FIG. 7A, the inner edges of recesses 72 are curved, which may help release stress. In accordance with alternative embodiments, as shown in FIG. 7B, the inner edges of recesses 72 are straight and vertical.

FIGS. 8A, 8B, 9A, and 9B illustrate cross-sectional views of intermediate stages in the formation of packages 100 in accordance with some embodiments of the present disclosure. These embodiments are similar to the embodiments shown in FIGS. 1 through 7A/7B, except recesses are formed to extend into package 58, rather than into top portion 70A of metal cap 70. Unless specified otherwise, the materials and the formation methods of the components in these embodiments are essentially the same as the like components, which are denoted by like reference numerals in the embodiments shown in FIGS. 1 through 7A/7B. The details regarding the formation process and the materials of the components shown in FIGS. 8A, 8B, 9A, and 9B may thus be found in the discussion of the embodiments shown in FIGS. 1 through 7A/7B.

Figure 8A:
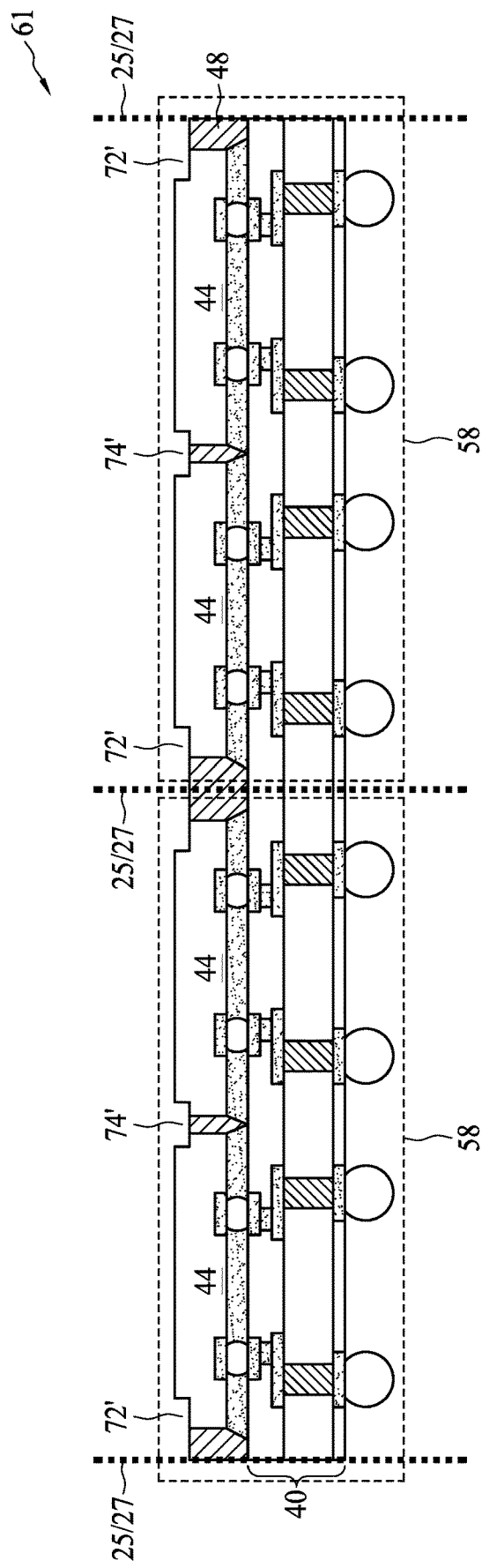
FIGS. 8A, 8B, 9A, and 9B illustrate the cross-sectional views and a top view of intermediate stages in the formation of packages in accordance with some embodiments.

The initial steps of these embodiments are essentially the same as shown in FIGS. 1 through 4. Next, as shown in FIG. 8A, recesses 72' and 74' are formed extending into composite wafer 61. Recesses 72' and 74' may be formed by cutting (using a blade), milling, grinding, or the like, wherein the top corner portions of dies 44 and encapsulating material 48 are removed. Accordingly, the formation of recesses 72' and 74' may be performed at the wafer level, and recesses 72' extend into neighboring packages 58.

Figure 8B:
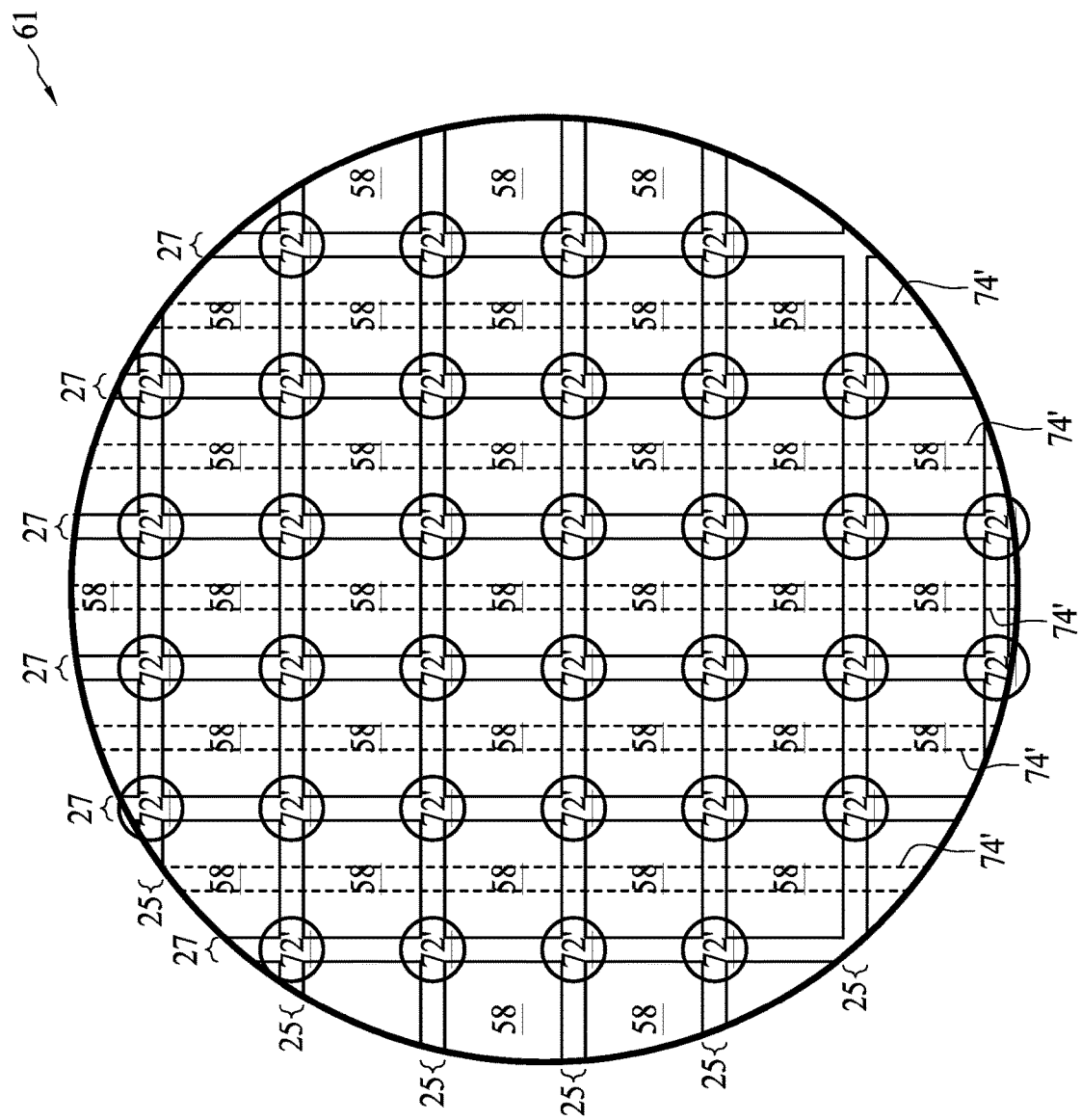

FIG. 8B illustrates a top view of composite wafer 61, which includes un-singulated packages 58 separated from each other by scribe lines 25 and 27. As shown in FIG. 8B, recesses 72' may be formed as discrete recesses, each located at a joint of four packages 58. Each of the recesses 72' may cross one of scribe lines 25 and one of scribe lines 27, and may extend over device dies 44 (not shown in FIG. 8B, refer to FIG. 10A). Recesses 74' may be formed as long strip-shaped recesses, each crossing an entire column of packages 58.

Figure 9A:
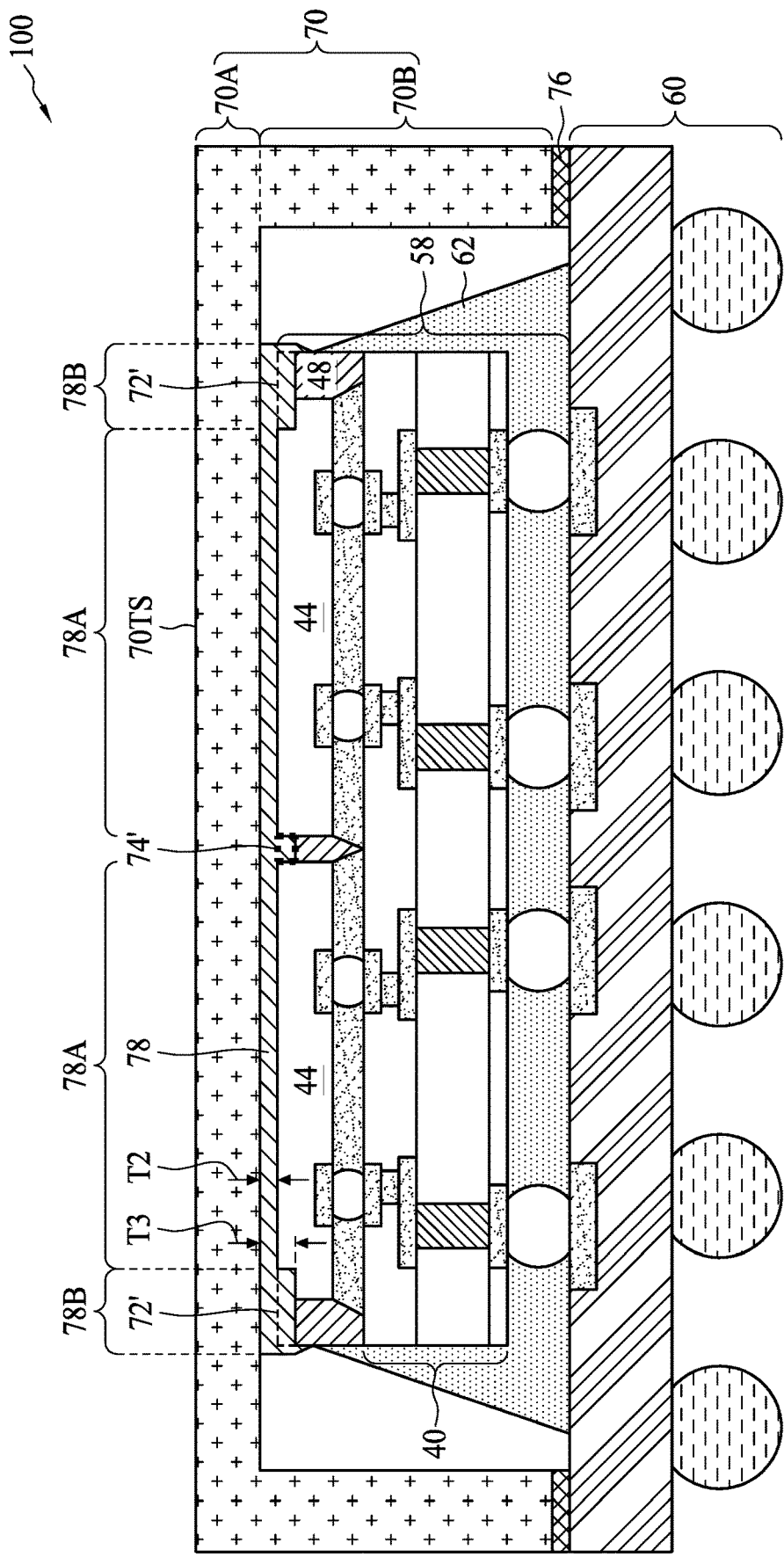
Figure 9B:
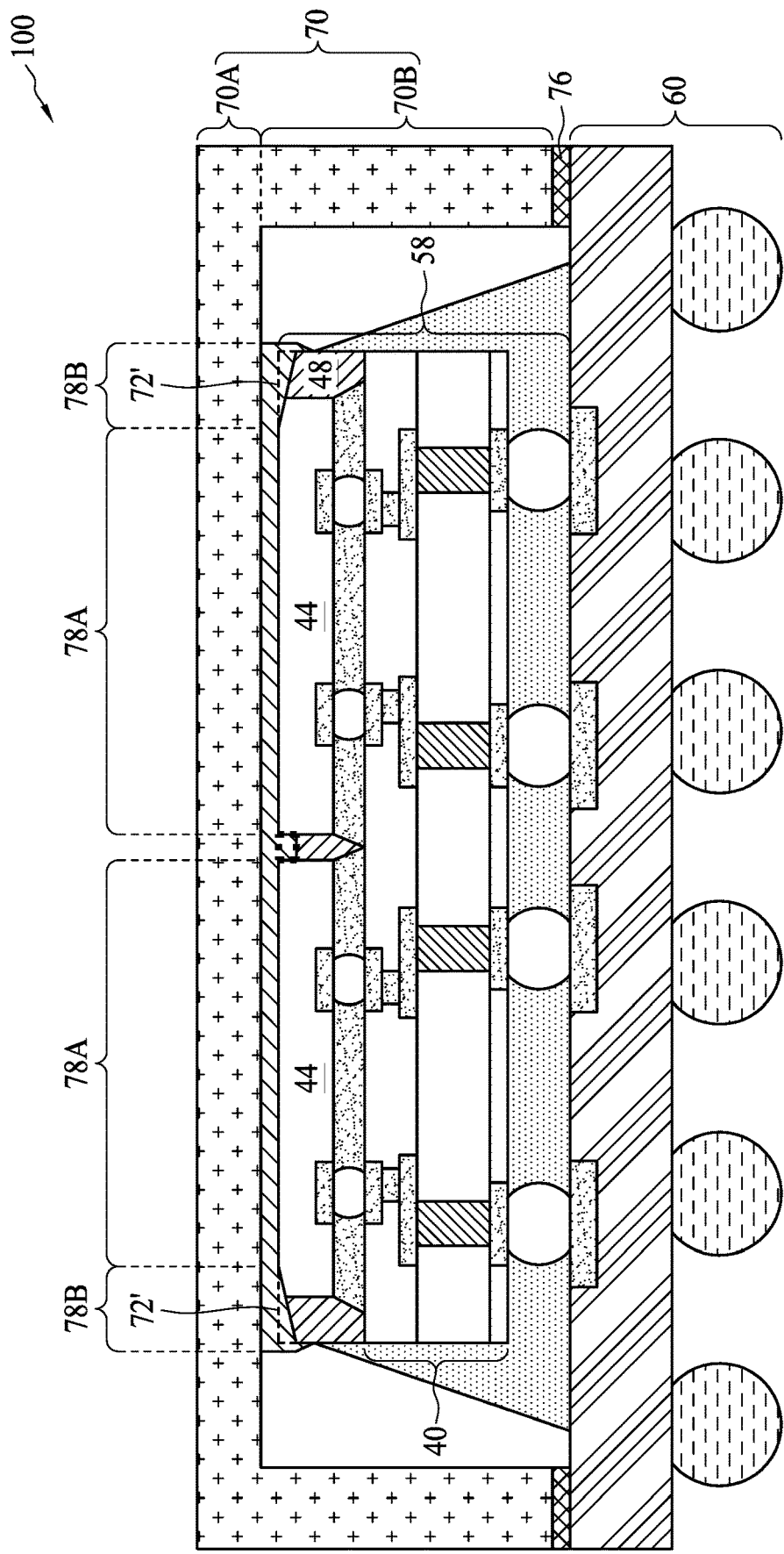

Next, composite wafer 61 is singulated along scribe lines 25 and 27 to result in packages 58, wherein one of packages 58 is illustrated in FIG. 9A. Metal cap 70 is then attached to package 58 through TIM 78. Similarly, TIM 78 includes thinner portions 78A and thicker portions 78B having thicknesses T2 and T3, respectively. In accordance with these embodiments, TIM 78 can be considered as having a planar portion expanding over the entire package 58, and protruding portions protruding from the planar portion down into the recesses 72' and 74' in package 58. As shown in FIG. 9A, the bottom surfaces of the protruding portions of TIM 78 may be planar and parallel to top surface 70TS of top portion 70A of metal cap 70. FIG. 9B illustrates an embodiment wherein the bottom surfaces of recesses 72' are slanted, and possibly straight or curved. The package 100 as shown in FIG. 9B may be formed using essentially the same method as shown in FIGS. 8A and 8B, except the tools for forming recesses may have different shapes.

FIGS. 10A through 10E illustrate the top views of recesses 72 and 74 in accordance with some embodiments of the present disclosure. It is noted that the embodiments shown in FIGS. 10A through 10E may be combined with either of the embodiments shown in FIGS. 1 through 9B when applicable. The cross-sectional views shown in FIGS. 1 through 9B may be obtained from the plane containing line C-C in FIGS. 10A through 10E. Although not shown, the top-view shapes of recesses 72' and 74' may be similar to that of recesses 72 and 74, respectively, except that recesses 72' and 74' will be limited in the regions of device dies 44 and encapsulating material 48.

Referring to FIG. 10A, recesses 72 extend from ring portion 70B to over device dies 44. Recess 74 also extends to opposite side portions of ring portion 70B. FIG. 10B through 10E illustrate the top views of packages 100 in accordance with alternative embodiments. These embodiments are similar to the embodiments shown in FIG. 10A.

Experiments have been performed to determine the stresses suffered by TIM. In some experiments, the high-stress corner regions were found as having the shape illustrated using dashed lines 75. In accordance with some embodiments of the present disclosure, the shapes of the inner edges of recesses 72 are selected to mimic the shapes of dashed lines 75, so that the effect in the reduction of stress is maximized, and the size of recesses 72 is minimized. By minimizing the sizes of recesses 72/74/72'/74', the adverse increase in the thermal resistance of TIM 78 may be minimized. In accordance with some embodiments, since the high-stress regions have curved (sometimes close to a quarter of a circle) inner edges (with the shape of dashed lines 75), recesses 72 are designed to have curved inner edges as shown in FIG. 10A.

Figure 10B:
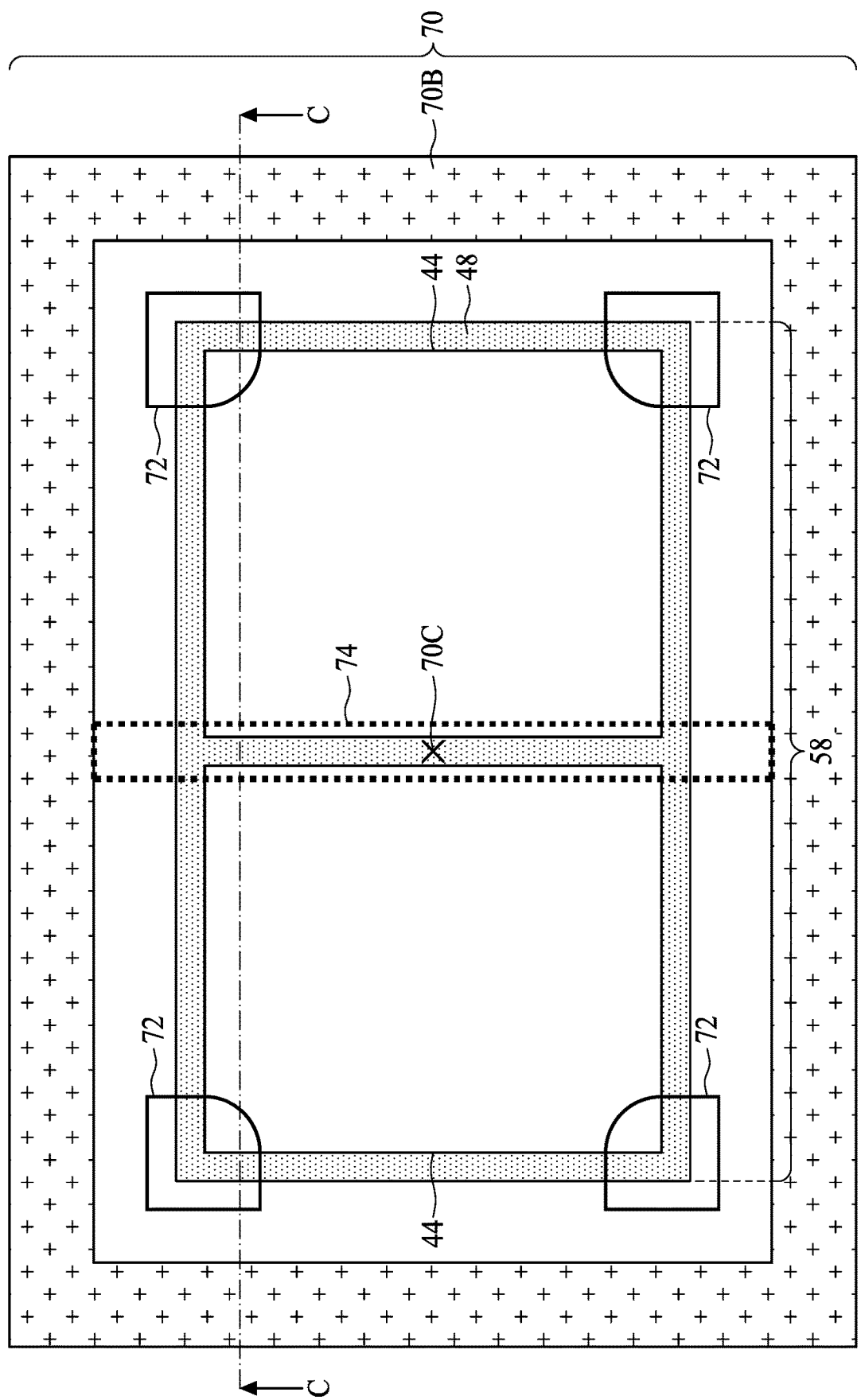
Figure 10C:
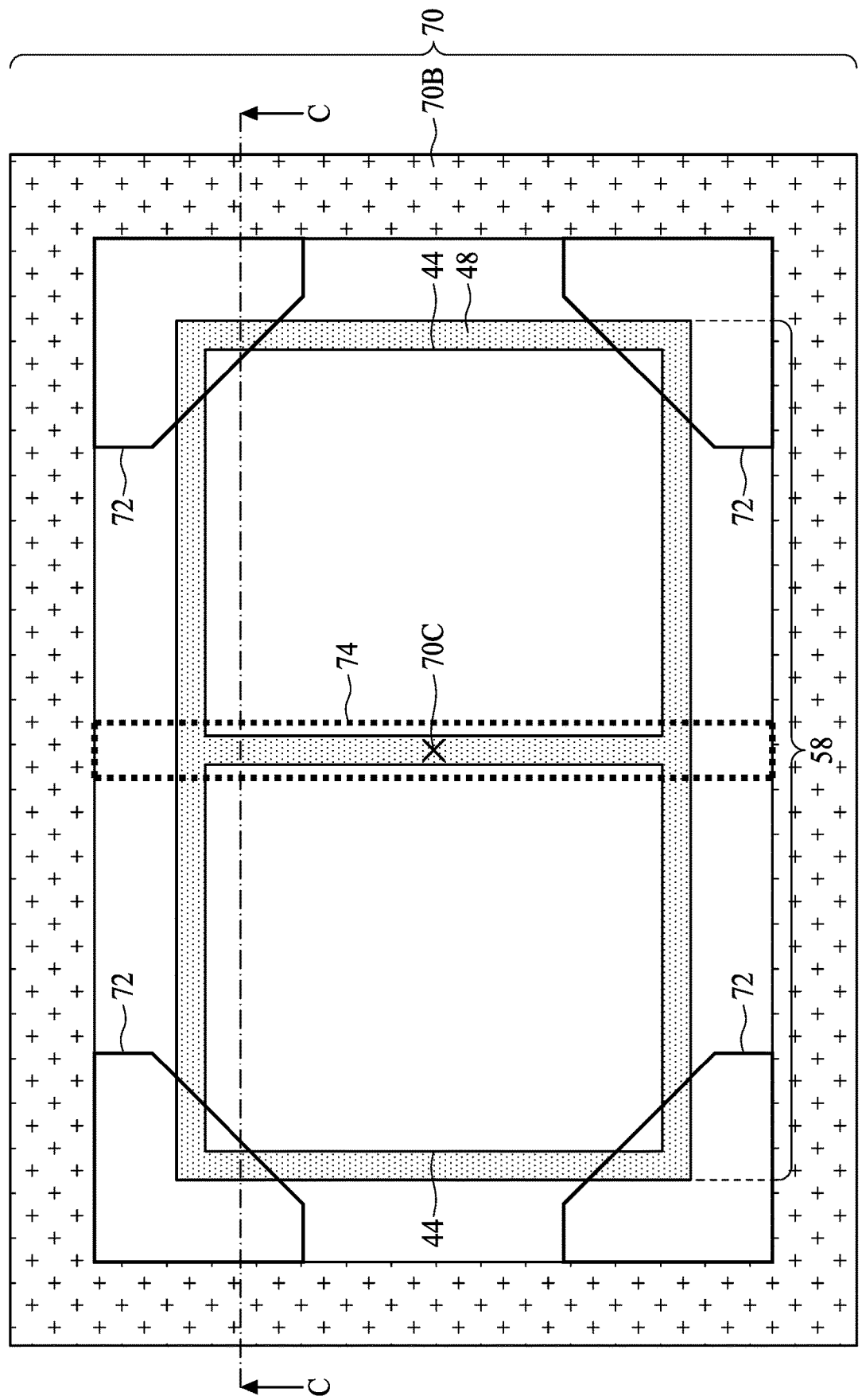
Figure 10D:
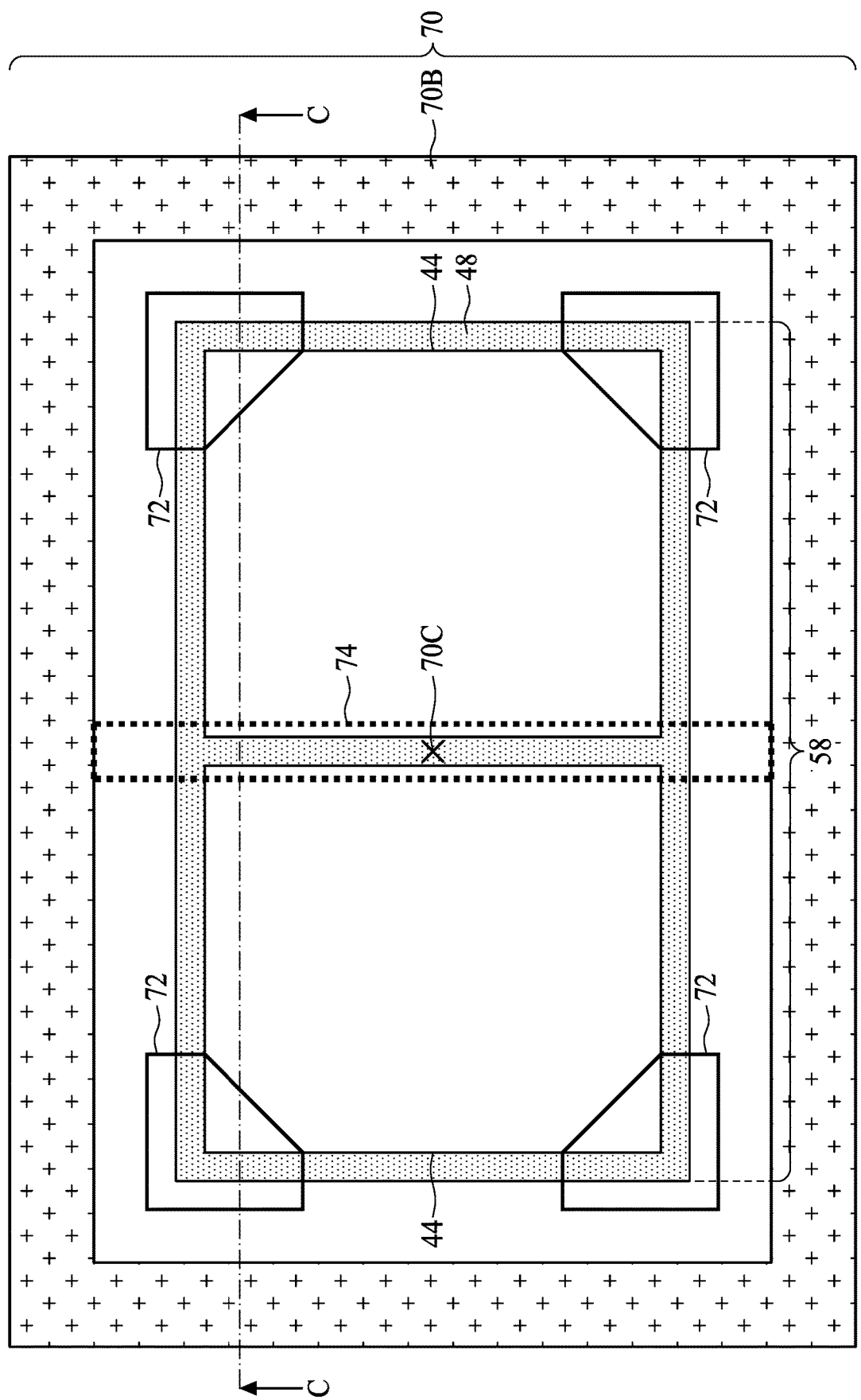
Figure 10E:
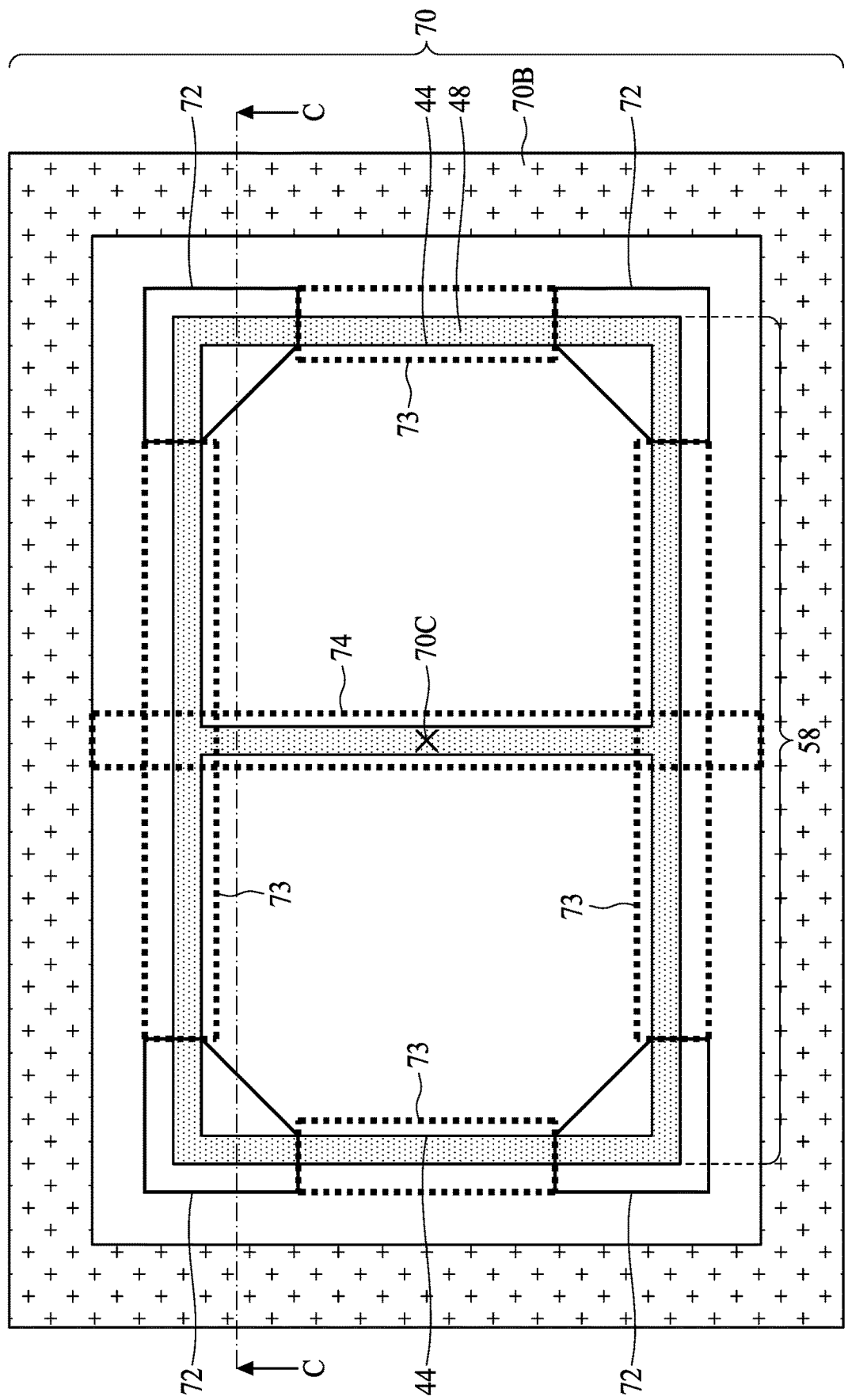

In the embodiments shown in FIG. 10B, recesses 72 are spaced apart from ring portions 70B. FIG. 10C illustrates recesses 72 have straight inner edges crossing over device dies 44 and encapsulating material 48, and recesses 72 extend to the side portions of ring portion 70B. In the embodiments shown in FIG. 10D, recesses 72 have straight inner edges crossing over device dies 44 and encapsulating material 48, and recesses 72 are spaced apart from the side portions of ring portion 70B. FIG. 10E illustrates package 100, wherein additional recesses 73 are formed extending from the bottom surface of the top portion 70A of metal cap 70 into top portion 70A. Recesses 73 overlap the edge portions of package 58, wherein recesses 73 may, or may not, be connected to recesses 72. Accordingly, recesses 73 and 74 in combination form a full ring overlapping the entire peripheral region of package 58. Similar, the portions of TIM 78 (FIGS. 7A, 7B, 9A, and 9B) may extend into recesses 73. Since the stress at edges of device dies 44 and encapsulating material 48 is also high (although smaller than in corner regions), forming recesses 73 also help release stress in these regions.

The embodiments of the present disclosure have some advantageous features. By forming recesses so that the thickness of TIM increases in the high-stressed regions, the TIM is able to absorb higher stress in thermal cycles, and hence the delamination and cracking of TIM from device dies and metal cap are reduced. The area of the TIM having increased thickness is limited, and most of the TIM does not have increased thickness. Accordingly, the ability of TIM for conducting heat is not significantly affected.

In accordance with some embodiments of the present disclosure, a package includes a package component, a device die over and bonded to the package component, a metal cap having a top portion over the device die, and a thermal interface material between and contacting the device die and the metal cap. The thermal interface material includes a first portion directly over an inner portion of the device die, and a second portion extending directly over a corner region of the device die. The first portion has a first thickness. The second portion has a second thickness greater than the first thickness.

In accordance with some embodiments of the present disclosure, a package includes a stack and a metal cap. The stack includes an interposer, a first device die and a second device die over and bonded to the interposer, a package substrate underlying and bonded to the interposer, and an encapsulating material encircling each of the first device die and the second device die. The metal cap includes a top portion and a skirt portion underlying and connected to the top portion. An adhesive adheres the skirt portion to the package substrate. A thermal interface material has a planar portion having a substantially uniform thickness, and a protruding portion protruding up or down from the planar portion. The protruding portion overlaps a corner portion of the stack.

In accordance with some embodiments of the present disclosure, a package includes a package substrate, an interposer over and bonded to the package substrate, and a device die over and bonded to the interposer. A metal cap has a top portion over the device die. The top portion has a plurality of recesses, each recessing from a bottom surface of the top portion into the top portion. The metal cap further includes a skirt portion encircling the device die and the interposer therein. The skirt portion is adhered to the package substrate, and the skirt portion has four side portions. A thermal interface material is between and contacting the device die and the metal cap. The thermal interface material extends into the four recesses of the top portion of the metal cap.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    bonding a first package component and a second package component to a third package component;
    encapsulating the first package component and the second package component in an encapsulant;
    applying a thermal interface material, wherein a bottom surface of the thermal interface material is in contact with top surfaces of the encapsulant, the first package component, and the second package component; and
    placing a metal cap onto the thermal interface material, wherein a top surface of the thermal interface material is in contact with an additional bottom surface of the metal cap, and wherein one of the bottom surface and the top surface of the thermal interface material comprises a lower portion and a higher portion higher than the lower portion.

2. The method of claim 1, wherein the bottom surface of the thermal interface material comprises the lower portion and the higher portion.

3. The method of claim 2, wherein the encapsulating comprises:
    applying the encapsulant;
    planarizing the encapsulant to be coplanar with top surfaces of the first package component and the second package component; and
    recessing a part of the encapsulant to form a recess, wherein the thermal interface material fills the recess.

4. The method of claim 3, wherein recessing the part of the encapsulant is performed through cutting using a blade, milling, or grinding.

5. The method of claim 3, wherein the recessed part of the encapsulant is between the first package component and the second package component.

6. The method of claim 1, wherein the top surface of the thermal interface material comprises the lower portion and the higher portion, and wherein the method further comprises:
    pre-forming the metal cap; and
    pressing the metal cap to shape the thermal interface material and to make the top surface of the thermal interface material to have the lower portion and the higher portion.

7. The method of claim 1, wherein the first package component comprises a first edge and a second edge joining with each other to form a corner, and wherein the lower portion of the top surface overlaps:
    the corner;
    a portion of the first package component comprising the corner; and
    a portion of the encapsulant, with the portion of the encapsulant joining the corner.

8. The method of claim 7, wherein the encapsulant comprises a side portion joining the first edge, and the higher portion of the top surface of the thermal interface material overlaps a portion of the first edge and the side portion of the encapsulant.

9. The method of claim 1, wherein the bottom surface of the thermal interface material is in direct contact with a top surface of each of the encapsulant, the first package component, and the second package component.

10. A method comprising:
encapsulating a first package component and a second package component in an encapsulant;
performing a planarization process to level a first top surface of the first package component, a second top surface of the second package component, and a third top surface of the encapsulant;
recessing the third top surface of the encapsulant to form a recess;
applying a thermal interface material to contact the first package component, the second package component, and the encapsulant, wherein the thermal interface material further extends into the recess; and
attaching a cap overlying and contacting the thermal interface material.

11. The method of claim 10, wherein in the recessing, an intermediate portion of the encapsulant between the first package component and the second package component is recessed.

12. The method of claim 11, wherein in the recessing, a portion of the first package component joining the intermediate portion of the encapsulant is also recessed.

13. The method of claim 11, wherein after the cap is attached to the thermal interface material, an entirety of a top surface of the thermal interface material is coplanar.

14. The method of claim 10, wherein in the recessing, a corner portion of the encapsulant adjoining a corner of the first package component is recessed.

15. The method of claim 14, wherein a first edge of the first package component joins a second edge of the first package component to form the corner of the first package component, and wherein an edge portion of the encapsulant contacting the first edge is not recessed.

16. A method comprising:
bonding a device die to a package component;
molding the device die in a molding compound;
removing a first top surface portion of the device die and a second top surface portion of the molding compound to form a recess;
applying a thermal interface material extending into the recess; and
placing a metal cap over the thermal interface material.

17. The method of claim 16 further comprising, before the removing, planarizing top surfaces of the device die and the molding compound.

18. The method of claim 16, wherein the removing is selectively preformed on first portions of the device die and the molding compound without being performed on second portions of the device die and the molding compound.

19. The method of claim 16, wherein the removing is performed through a method selected from cutting using a blade, milling, and grinding.

20. The method of claim 16, wherein the first top surface portion of the device die comprises a corner portion of the device die.

* * * * *